United States Patent
Daniels

(10) Patent No.: US 11,486,926 B1
(45) Date of Patent: Nov. 1, 2022

(54) WEAROUT CARD USE COUNT

(71) Applicant: XILINX, INC., San Jose, CA (US)

(72) Inventor: Robert Andrew Daniels, March (GB)

(73) Assignee: XILINX, INC., San Jose, CA (US)

( * ) Notice: Subject to any disclaimer, the term of this patent is extended or adjusted under 35 U.S.C. 154(b) by 54 days.

(21) Appl. No.: 17/112,430

(22) Filed: Dec. 4, 2020

(51) Int. Cl.
   *G01R 31/317* (2006.01)
   *G01R 31/28* (2006.01)

(52) U.S. Cl.
   CPC ... *G01R 31/31724* (2013.01); *G01R 31/2886* (2013.01)

(58) Field of Classification Search
   CPC .............. G01R 31/31724; G01R 31/2886
   See application file for complete search history.

(56) References Cited

U.S. PATENT DOCUMENTS

| | | | | |
|---|---|---|---|---|
| 4,942,576 | A * | 7/1990 | Busack | G01R 31/31935 365/201 |
| 8,756,465 | B2 * | 6/2014 | Akita | G11C 29/56008 714/719 |
| 11,215,663 | B2 * | 1/2022 | Reedholm | G01R 31/2889 |
| 2013/0060502 | A1 * | 3/2013 | Dang | G01R 31/318544 702/108 |
| 2016/0245864 | A1 * | 8/2016 | Mydill | G01R 31/31908 |
| 2017/0256324 | A1 * | 9/2017 | Kagami | G11C 29/56016 |
| 2020/0008085 | A1 * | 1/2020 | Chakraborty | H04L 43/0823 |
| 2020/0033408 | A1 * | 1/2020 | Rogel-Favila | G01R 31/2844 |

* cited by examiner

*Primary Examiner* — Akm Zakaria
(74) *Attorney, Agent, or Firm* — Patterson + Sheridan, LLP

(57) ABSTRACT

Examples described herein provide a wearout card and a method for using the wearout card. The wearout card generally includes a first set of connectors configured to connect the testing apparatus to a testing controller, and a second set of connectors configured to connect the testing apparatus to a device under test (DUT). The wearout card can also include a memory configured to store identifying information of the testing apparatus and a use counter indicating a number of times different DUTs have been connected to the second set of connectors.

20 Claims, 5 Drawing Sheets

WEAROUT CARD USE COUNT

TECHNICAL FIELD

Examples of the present disclosure generally relate to testing systems and, in particular, to wearout card use counts for testing systems.

BACKGROUND

After an integrated circuit card is manufactured or produced, the integrated circuit card is tested to ensure that the card was manufactured properly. In order to test the card, the integrated circuit card (also referred to herein as the device under test (DUT)) is coupled to a testing controller.

The problem with coupling the DUT to a testing controller is that the connections of the testing controller, to which the corresponding connectors of the DUT connect, wear out and fail. The failure of connectors on the testing controller occurs with mass produced devices (e.g., MC cards) due to the number of insertions (or connections) between the DUTs and the testing controller. For example, a PCIe connector is rated for a thousand insertions, and some specialized connectors (e.g., Open Compute Project 2 (OCP2) connectors) may be rated for as low as fifty insertions. A testing controller can be used to test tens if not hundreds of DUTs every day. If the DUTs are connected directly to the testing controller, this means the connectors on the testing controllers may wear out weekly, if not daily, Replacing a worn out testing controller is expensive.

SUMMARY

These and other aspects may be understood with reference to the following detailed description. One example is a method using a testing controller. The method generally includes: detecting information associated with a device under test (DUT), wherein the DUT is coupled to a testing apparatus via a first set of connectors and the testing apparatus is coupled to the testing controller via a second set of connectors; upon determining that a use counter stored in a memory of the testing apparatus is less than a predefined use threshold, incrementing the use counter in the memory of the testing apparatus; and performing testing on the DUT.

Another example is a testing apparatus comprising: a first set of connectors configured to connect the testing apparatus to a testing controller, a second set of connectors configured to connect to the testing apparatus to a device under test (DUT), and a memory configured to store identifying information of the testing apparatus and a use counter indicating a number of times the device under test has been connected to the second set of connectors.

Another example is a testing system including a testing apparatus coupled to a testing controller and to a device under test (DUT), the testing controller coupled to a host processor. The testing apparatus generally includes a first set of connectors coupling the testing apparatus to the testing controller, a second set of connectors coupling the testing apparatus to the DUT, and a memory configured to store identifying information of the testing apparatus and a counter indicating a number of times the device under test has been connected to the second set of connectors. The testing controller is configured to: detect information associated with the device under test (DUT), wherein the DUT is coupled to the testing apparatus via the second set of connectors and the testing apparatus is coupled to the testing controller via the first set of controllers; upon determining that the use counter stored in the memory of the testing apparatus is less than a predefined use threshold, increment the use counter in the memory of the testing apparatus; and perform testing on the DUT.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
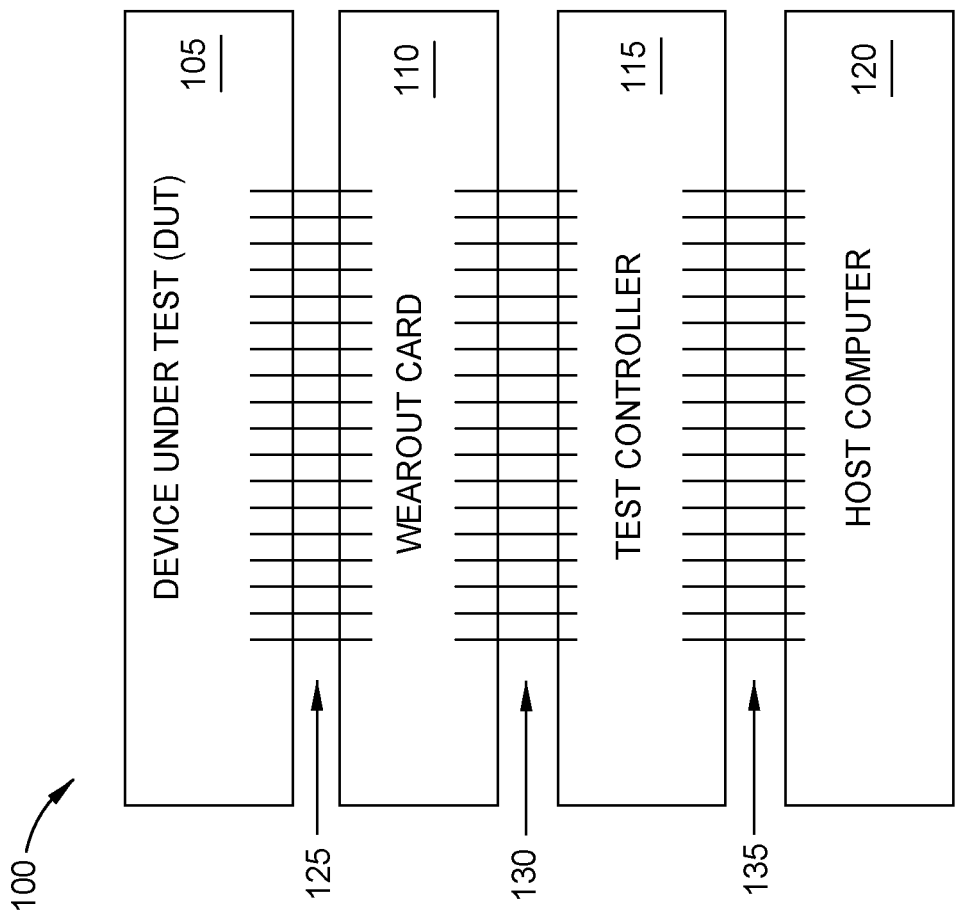
FIG. 1 is a block diagram depicting an example of a testing system using a wearout card, according to one example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein relate to wearout cards in testing systems. In some solutions, intermediary cards, such as wearout cards, are used to mitigate the wearout of the connectors of the testing controllers. For example, wearout cards are coupled between the testing controller and the DUTs being tested. Instead of the connectors of the testing controller being worn out due to insertions of the DUTs, the connectors of the wearout cards may be worn out and when the connectors of the wearout cards start failing, the wearout cards may be thrown away, instead of the testing controllers, which cost much more than the wearout cards in terms of production. However, wearout cards may be thrown away before theft connectors are worn out. The embodiments herein describe techniques for accurately tracking the number of connections made between the wearout card and the DUTs.

The techniques disclosed herein can be used with any testing system, but may be particularly used with a testing system having wearout cards. As described herein, a wearout card may include an on-board memory that stores information about the wearout card and about the DUTs. For example, the wearout card's on-board memory may include a use counter of the wearout card, a unique ID (e.g., serial number) and date of manufacture of the wearout card. This information may be accessed during a hardware test. In some examples, a programmable device on the wearout card may be accessed during testing and the use counter may be incremented. Once the use counter reaches or exceeds a predefined use threshold, the testing system (e.g., via the testing controller) may abort testing of DUTs so that the wearout card may be changed.

Implementing a use count in a memory of the wearout card may prolong the use of the wearout card. For example, by counting the number of insertions by a DUT into connectors of the wearout card, a testing system has information on when to switch out the wearout card to prevent connection failures between the wearout card and the DUT. Also, the testing system can prevent the wearout card from being prematurely switched out and wasting the remaining number of insertions available to the wearout card.

FIG. 1 is a block diagram of an example testing system 100, according to some examples. The testing system 100 includes a DUT 105, a wearout card 110, a testing controller 115, and a host computer 120. The DUT 105 and wearout card 110 are coupled together via a first set of connections 125 (e.g., PCIe connections, Accelerated Graphics Port (AGP) connections, or other connections using other connection protocols). The wearout card 110 and the testing controller 115 are coupled via a second set of connections 130 (e.g., PCIe connections, Accelerated Graphics Port (AGP) connections, or other connections using other connection protocols). The testing controller 115 and the host computer 120 are coupled via a controller connection 135 (e.g., PCIe connections, Universal Serial Bus (USB) connections, Joint Test Action Group (JTAG) connections, or other connections using other connection protocols).

The DUT 105 is the device to be tested using the testing system 100. The DUT 105 may be an integrated circuit card, such as a field programmable gate array (FPGA) or an application-specific integrated circuit (ASIC) that is mounted on a substrate such as a printed circuit board (PCB). The DUT 105 may be generally described herein as a chip package assembly, and may be any chip package assembly to be tested. The DUT 105 includes connectors that can be inserted into corresponding connectors on the wearout card 110.

The wearout card 110 is disposed between the DUT 105 and the testing controller 115. Details about the wearout card 110 are discussed later with regards to FIG. 2.

The DUT connectors 220 are configured to connect the wearout card 110 to a different DUT during each test cycle. For example, the DUT connectors 220 may facilitate the connections 125 between the wearout card 110 and the DUT 105 as illustrated in FIG. 1. The DUT connectors 220 can allow for a number of insertions by the corresponding connectors of the DUT 105 in order to create the connections 125 of FIG. 1. In some examples, the DUT connectors 220 conform to a connection protocol, such as I$^2$C protocol or OCP2 (Open Compute Project 2), and may be PCIe connectors. In one embodiment, the DUT connectors 220 are replaceable, so once the use counter 225 stored in the memory 205 meets or exceeds its predefined use threshold, the wearout card 110 can be recommissioned by replacing the DUT connectors 220 with new connectors. In that example, the wearout card 110 need not be replaced or thrown away because in some examples, the DUT connectors 220 can be the only component that need replacement as the DUT connectors 220 undergo the most use with each insertion of multiple DUTs. However, in other embodiments, once the use counter 225 reaches the threshold, the entire wearout card 110 may be replaced by a brand new wearout card 110 in the testing setup.

The testing controller 115 tests the DUT 105 using the wearout card 110. The testing controller 115 may be an integrated circuit card, such as a field programmable gate array (FPGA) or an application-specific integrated circuit (ASIC) mounted on a substrate such as a printed circuit board (PCB). The testing controller 115 may include a memory to facilitate testing the DUT 105, support circuitry to provide additional functionalities during testing of the DUT 105, and wearout card connectors to facilitate connections 130 with the wearout card 110. The testing controller 115 can include host computer connectors to facilitate connections with the host computer 120. In some examples, the testing controller 115 may perform operations under direction of the host computer 120.

The host computer 120 transmits instructions to the testing controller 115 to test the DUT 105 through the wearout card 110. The host computer 120 is coupled to the testing controller 115 via a controller connection 135. In one embodiment, the host computer 120 contains a testing application that provides the instructions to the testing controller 115. In addition, the testing controller 115 may receive data from the DUT 105 which it then forwards to the testing application in the host computer 120. Based on this data, the testing application can verify that the DUT 105 is operating as expected, and thus, has passed the test(s). If the testing application determines that the DUT 105 is not behaving as expected (e.g., failed the test(s)), it can alert a user.

In some examples, the host computer 120 may be coupled to input/output (IO) devices and a display to allow a user to interact with the host computer 120. In some examples, the host computer 120 includes various support circuits and IO interfaces to support the host computer 120 and to allow interaction between the host computer 120 and the user. The support circuits can include conventional cache, power supplies, clock circuits, data registers, IO interfaces, and the like. The IO interfaces can be directly coupled to the testing controller 115. The IO interfaces can be coupled to IO devices, which can include a conventional keyboard, a mouse, and the like. The IO interfaces can also be coupled to the display, which can present a graphical user interface (GUI) to a user.

Figure 2:
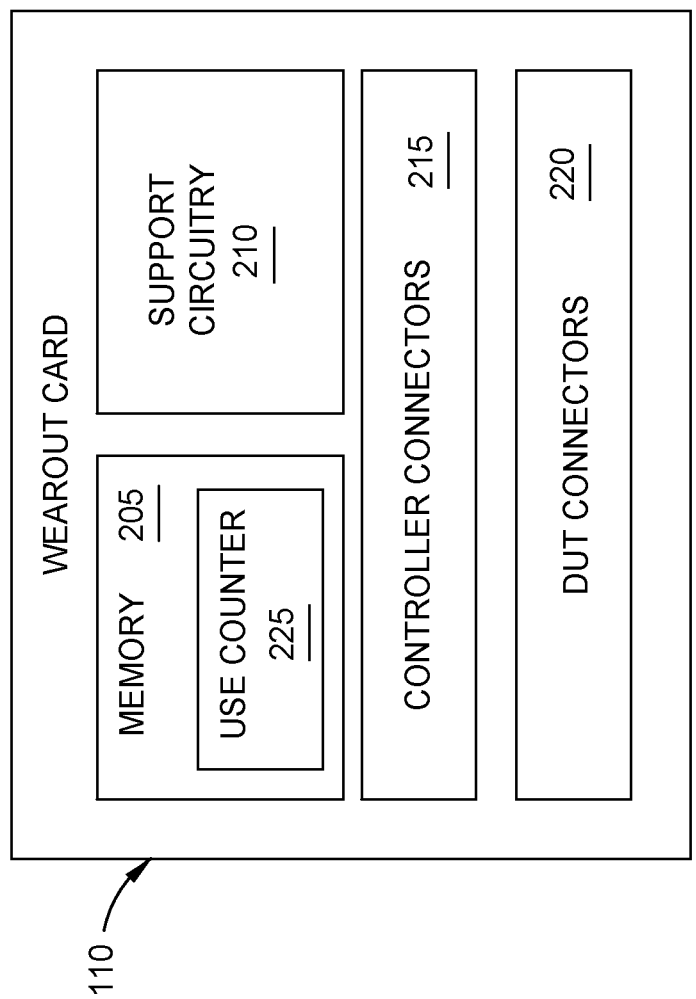
FIG. 2 is a block diagram illustrating an example of a wearout card, according to one example.

FIG. 2 is a block diagram of the wearout card 110 of FIG. 1. The wearout card 110 may include one or more chips (e.g., microcontrollers and memory) and connectors mounted on a substrate such as a PCB. In this example, the wearout card 110 includes a memory 205, support circuitry 210, controller connectors 215, and DUT connectors 220.

The memory 205 is configured to store identifying information about the wearout card 110 and a use counter 225. Identifying information can include the date of manufacture of the wearout card 110 and a unique identifier for the wearout card 110 (e.g., a unique serial number). The use counter 225 stored in the memory 205 indicates the number of times the DUT connectors 220 have been connected to a DUT. The memory 205 can be electronically erasable programmable read-only memory (EEPROM). In some examples, the memory 205 can be one or more non-transitory storage mediums that store information and can include, for example, read-only memory (ROM), or a combination of ROM and EEPROM. The memory 205 can include a unique serial number of the wearout card 110, which is programmed only once when the wearout card 110 is manufactured. The unique serial number does not change and is read during the DUT manufacturing test. The serial number of the wearout card 110 and the current use count are reported in test logs during a DUT manufacturing test.

The support circuitry 210 includes circuit components needed to support testing of the DUT 105 by the testing controller 115. In some examples, the support circuitry 210 includes debug circuitry, hardware synchronization circuitry, and direct memory access circuitry. The circuit components included in the support circuitry may depend on the DUT 105 to be tested and the components of the testing controller 115. For example, the support circuitry may include additional input/output connections to test corresponding functionality on the DUT 105, or the support circuitry may include decoders, encoders, and hardware simulators needed to test corresponding functionality on the DUT 105.

The controller connectors 215 are configured to connect the wearout card 110 to the testing controller 115. For example, the controller connectors 215 may facilitate the connections 130 between the testing controller 115 and the wearout card 110 as illustrated in FIG. 1. The controller connectors 215 can allow for a number of insertions by the corresponding connectors of the testing controller 115. In some examples, the controller connectors 215 conform to a connection protocol, such as $I^2C$ protocol.

Figure 3:
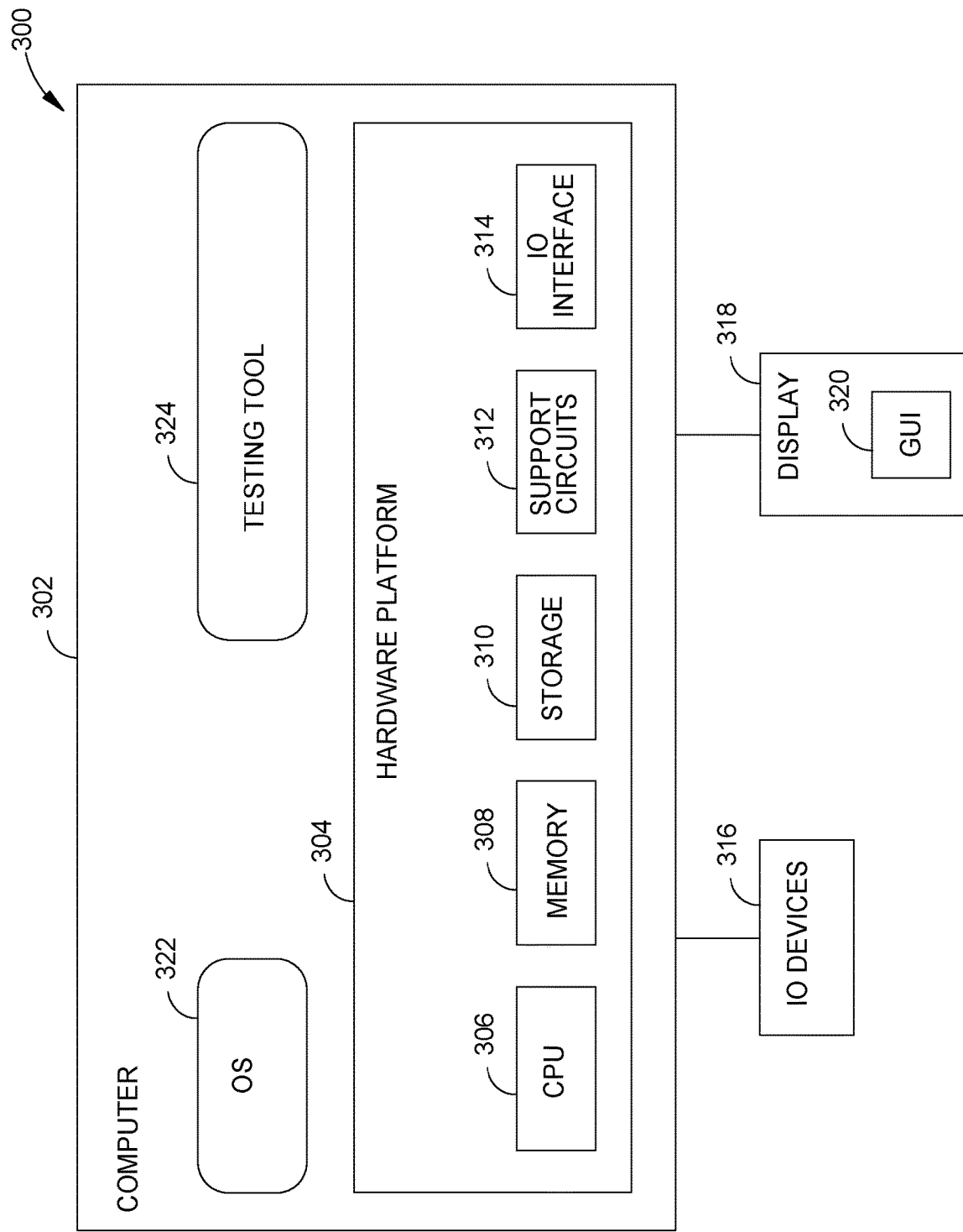
FIG. 3 is a block diagram illustrating examples operations using a testing controller and a wearout card, according to one example.

FIG. 3 is a block diagram depicting an example of a host computer 300 (e.g., the host computer 120) that can be used to test a DUT (e.g., the DUT 105) using the testing controller 115 and the wearout card 110, in accordance with some examples. The host computer 300 is coupled to input/output (IO) devices 316 and a display 318. The host computer 300 includes a hardware platform 304 that can include components of a computing device, such as a central processing unit (CPU) 306, a system memory 308, a storage 310, various support circuits 312, and an IO interface 314. The CPU 306 can include one or more processing cores. The CPU 306 is configured to execute program instruction code that performs one or more operations described herein. The program instruction code can be stored in the system memory 308, storage 310, or any other memory in the hardware platform 304 (e.g., cache memory). The system memory 308 includes one or more non-transitory storage mediums that store information and can include, for example, random access memory (RAM), read-only memory (ROM), or a combination thereof. The storage 310 includes one or more local non-transitory storage mediums, such as hard disks, flash memory modules, solid state disks, optical disks, and the like. The storage 310 can also include interface(s) configured for communication with one or more network data storage systems. The support circuits 312 can include cache, power supplies, clock circuits, data registers, IO interfaces, and the like. The IO interface 314 includes interfaces to/from the host computer 300. The IO interface 314 can be coupled to the IO devices 316, which can include a keyboard, mouse, and the like. The IO interface 314 can also be coupled to the display 318, which can present a graphical user interface (GUI) 320 to a user.

The host computer 300 further includes a software platform comprising an operating system (OS) 322 and a testing tool 324 (e.g., a testing application). The OS 322 and the testing tool 324 include program instruction code that is executed by the CPU 306 and can be stored in the system memory 308, storage 310, or any other memory. The OS 322 can include any known operating system and the like. The testing tool 324 is a software application that executes within the OS 322, which provides an interface to the hardware platform 304. Some operations of the testing tool 324 include various ones of the operations 400 of FIG. 4.

Figure 4:
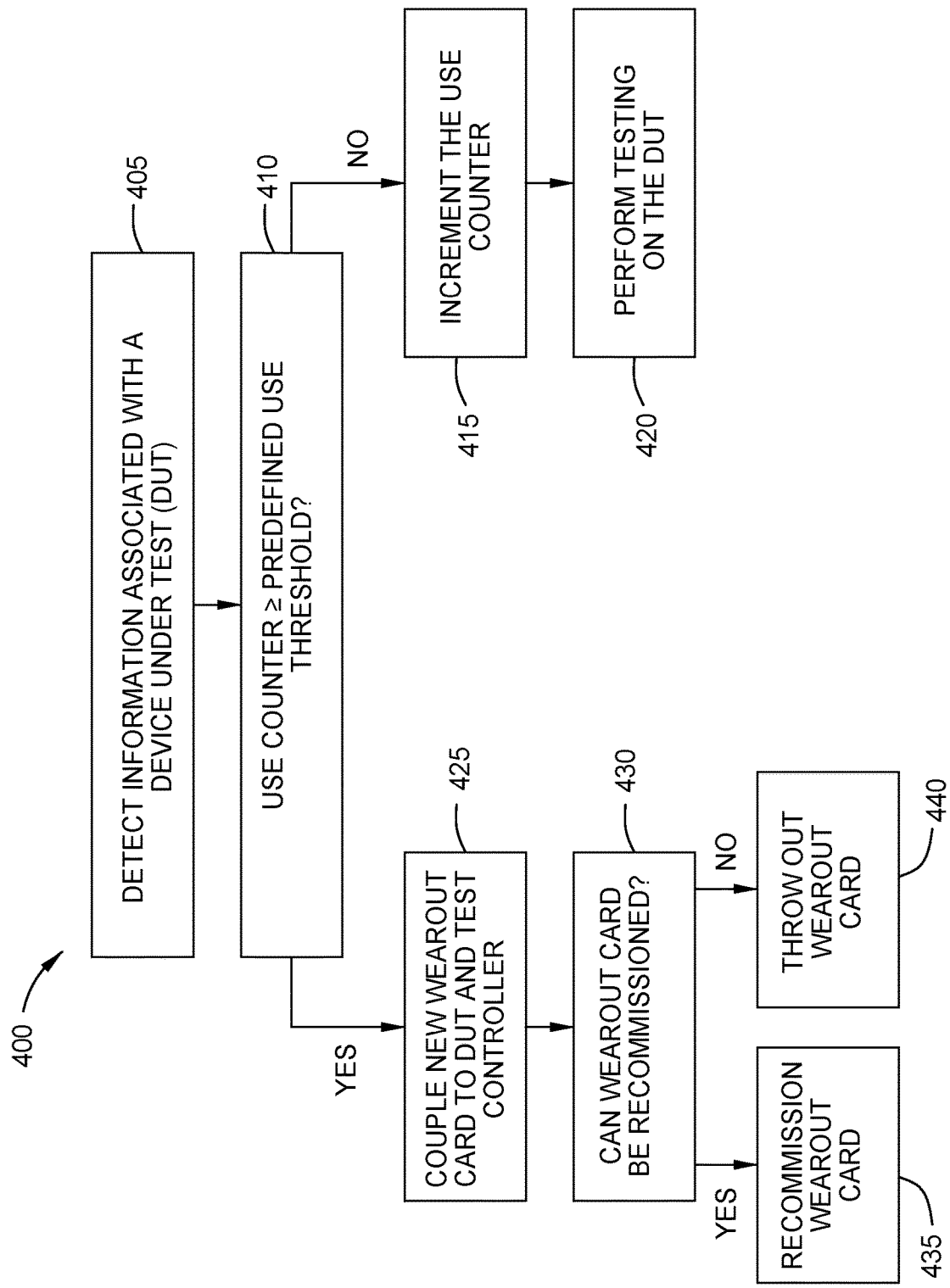
FIG. 4 is a flowchart of a technique using a testing controller and a wearout card, according to one example.

FIG. 4 is a flowchart of a technique to test the DUT 105 using the testing controller 115 and the wearout card 110 of FIG. 1, according to one example. Operations 400 can be performed by the testing controller 115 of FIG. 1.

Operations 400 begin at 405 with the testing controller 115 detecting information associated with a DUT (e.g., DUT 105) coupled to a wearout card (e.g., wearout card 110) (also referred herein as a testing apparatus) via a first set of connectors, and the wearout card 110 is coupled to the testing controller 115 via a second set of connectors. In one embodiment, detecting information associated with the DUT 105 includes detecting identifying information of the DUT 105, such as a unique identifier for the DUT 105 and a date of manufacture of the DUT 105.

At 410, the testing controller 115 determines whether a use counter 225 stored in the memory 205 of the wearout card 110 is less than a predefined use threshold. The predefined use threshold depends on the durability or type of the connection between the wearout card 110 and the DUT 105 (e.g., connections 125 of FIG. 1). For example, if the connectors between the wearout card 110 and DUT 105 are PCIe connectors, the predefined use threshold may be a thousand insertions. Alternatively, if the connectors between the wearout card 110 and the DUT 105 are OCP2 connectors, the predefined use threshold may be only fifty insertions. The predefined use threshold can indicate a maximum insertion cycle (i.e., a number of insertions within which a connection failure is unlikely to occur). Put differently, the threshold can be set based on the number of insertions that could cause the connectors on the wearout card 110 to wear out or fail. Accordingly, if the use counter 225 is less than the predefined use threshold, the testing controller 115 can continue to use the wearout card 110 without changing out the wearout card 110 since the likelihood of the DUT connectors 220 failing is small. The testing controller 115 increments the use counter 225 stored in the memory 205 of the wearout card 110. The testing controller 115 can also store the information associated with the DUT 105 (i.e., the identifying information) in the memory 205 of the wearout card 110.

If the testing controller 115 determines that the use counter 225 is less than the predefined use threshold, at 415, the testing controller 115 increments the use counter 225 in the memory 205 of the wearout card 110. Including the use counter 225 in the memory 205 of the wearout card 110 allows for the use of the wearout card 110 with multiple testing controllers. Incrementing the use counter 225 indicates that the DUT 105 has been inserted into the DUT connectors 220 of the wearout card 110, and incrementing the use counter 225 occurs during a DUT manufacturing test. The use counter 225 can be stored in the memory 205 of the wearout card 110 because the use count indicates the number of times the wearout card 110 has been used.

In some examples, the testing controller 115 determines whether the DUT 105 is tested for the first time. Determining whether the DUT 105 has been tested before can indicate whether an insertion has occurred (e.g., a new DUT has been connected to the wearout card 110). Determining whether the DUT 105 is tested for the first time can include detecting identifying information associated with the DUT 105 and whether the identifying information has been stored in the memory 205 of the wearout card 110. For example, the testing controller 115 can examine the memory 205 of the wearout card 110 to determine whether the testing controller 115 had previously stored the identifying information (e.g., unique identifier, date of manufacture) for the DUT 105 in the memory 205 of the wearout card 110. If the identifying information has been stored in the memory 205 of the wearout card 110, the DUT 105 had already been tested before without being disconnected and the testing controller 115 does not need to increment the use counter 225. For example, the test may have been repeated on the same DUT without the DUT 105 being disconnected and then reconnected to the wearout card 110, in which case, the use counter 225 should not be incremented. However, in some examples, the DUT 105 may have been tested, disconnected, and reconnected. In such examples, even though the identifying information has been stored in the memory 205 of the wearout card 110, the testing controller 115 can determine that the same DUT was disconnected and reconnected and thus increment the use counter 225.

In some examples, the testing controller 115 compares the use counter 225 in the memory 205 of the wearout card 110 against the predefined use threshold stored in a lookup table. The lookup table can be stored in the memory of the testing controller 115 (e.g., in the test code used on the testing controller 115). The lookup table can include multiple predefined use thresholds for different connectors.

Upon determining the use counter 225 is equal to or greater than the predefined use threshold, the testing controller 115 may abort testing of the DUT 105 and at 425, a new wearout card is coupled to the DUT 105 and the testing controller 115. That is, when the use counter 225 stored in the memory 205 of the wearout card 110 meets or exceeds the predefined use threshold corresponding to the type of connectors of the wearout card 110, the testing controller 115 determines that wearout card 110 needs to be changed out with a new wearout card. As mentioned, changing out the current wearout card 110 for a new wearout card mitigates the likelihood of a connection failure between the DUT 105 and the wearout card 110. Accordingly, to allow the wearout card 110 to be changed out, the testing controller 115 aborts testing on the DUT 105.

Once the wearout card 110 is replaced with a new wearout card, the testing controller 115 can detect identifying information for the new wearout card. The identifying information can include a date of manufacture of the new wearout card and a unique identifier for the new wearout card. The testing controller 115 can also determine whether the wearout card is a new wearout card (e.g., by accessing the use counter in the memory of the wearout card, which should be zero as the wearout card is a new wearout card and has not been used in testing any DUTs).

In some examples, the wearout card 110 can be recommissioned. At 430, if the wearout card 110 can be recommissioned, then at 435, the wearout card 110 is recommissioned. Recommissioning the wearout card 110 can involve removing the DUT connectors (e.g., DUT connectors 220 illustrated in FIG. 2) and replacing these DUT connectors with new DUT connectors. During recommissioning, the use counter 225 stored in the memory 205 of the wearout card 110 is zero-ed out, reset, or cleared because the DUT connectors 220 have been replaced and the use counter 225 indicates the number of insertions for the current set of DUT connectors.

However, if the wearout card 110 cannot be recommissioned, then at 440, the wearout card 110 is thrown away, and a new wearout card is used.

At 420, the testing controller 115 tests the DUT 105. The testing controller 115 can commence testing on the DUT 105 once the testing controller 115 confirms that the use count is below the predefined use threshold for the wearout card 110. In some examples, performing testing on the DUT 105 involves putting the DUT 105 into boundary scan mode so that the testing controller 115 can test the DUT 105 by toggling various pins and components of the DUT 105.

Figure 5:
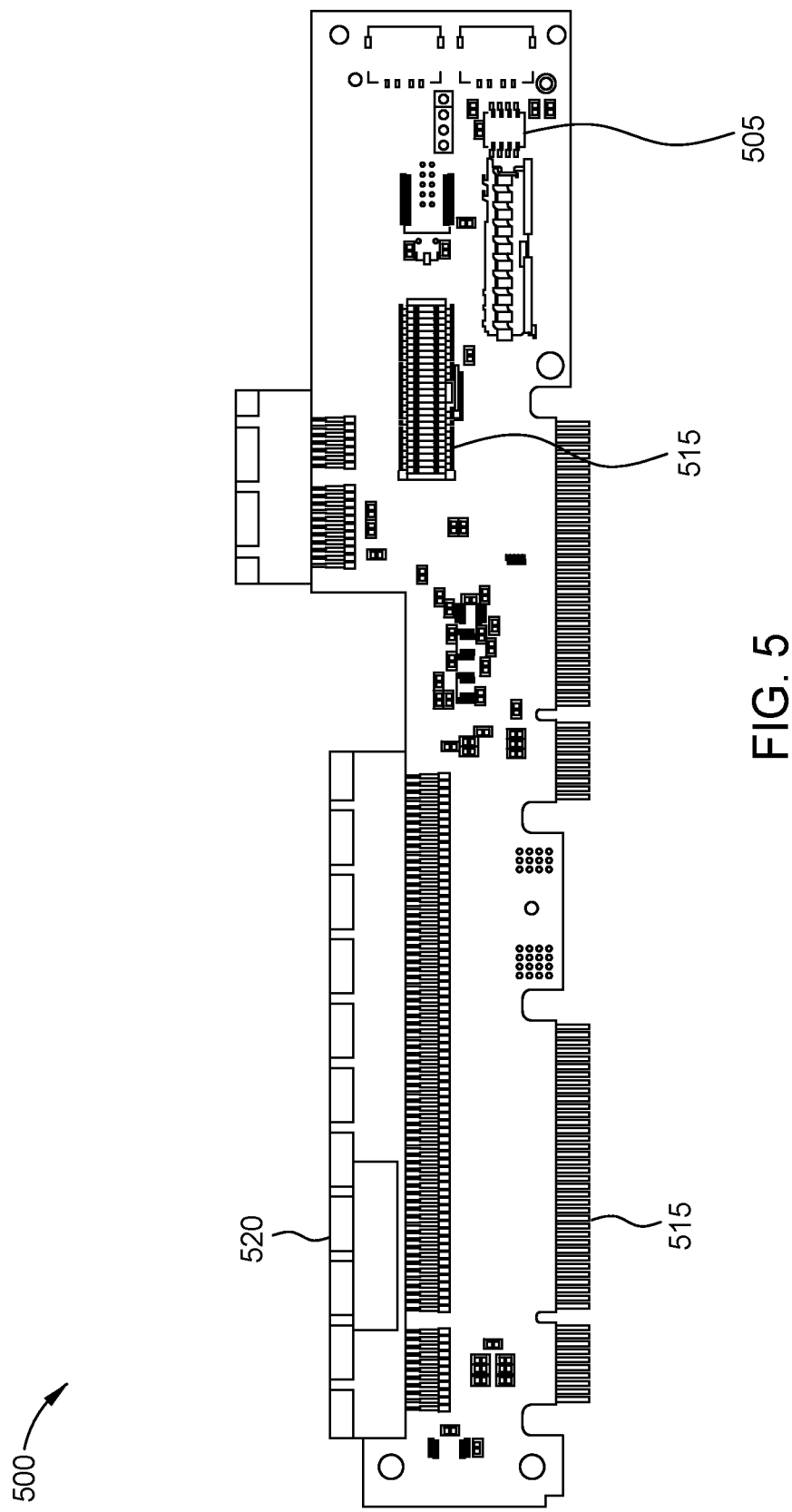
FIG. 5 illustrates an example wearout card, according to one example.

FIG. 5 illustrates an example wearout card 500 (e.g., the wearout card 110) to be used with the operations illustrated in FIG. 4, according to one example. As illustrated, the wearout card 500 includes a first set of connectors 520 (e.g., the DUT connectors 220), a second set of connectors 515 (e.g., the controller connectors 215), and a memory 505 (e.g., the memory 205) configured to store a use counter (e.g., the user counter 225) indicating the number of insertions a DUT (e.g., the DUT 105) has been inserted into the first set of connectors 520 of the wearout card 500.

In this example, the first set of connectors 520 are replaceable so that when the use counter meets the threshold, the wearout card 500 can be recommissioned by replacing the first set of connectors 520. Further, the memory 505 can be a reprogrammable memory, or read/write memory, so that the use counter can be reset. That way, the wearout card 500 can be reused in a testing system (e.g., the testing system 100).

The various examples described herein may employ various computer-implemented operations involving data stored in computer systems. For example, these operations may require physical manipulation of physical quantities usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more examples may be implemented as useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

One or more examples may be implemented as one or more computer programs or as one or more computer program modules embodied in one or more computer readable media. The term computer readable medium refers to any data storage device that can store data which can thereafter be input to a computer system, and computer readable media may be based on any existing or subsequently developed technology for embodying computer programs in a manner that enables them to be read by a computer. Examples of a computer readable medium (e.g., a non-transitory storage medium) include a hard drive, a Solid State Disk (SSD), network attached storage (NAS), read-only memory, random-access memory (e.g., a flash memory device), a CD (Compact Discs), CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

While the foregoing is directed to specific examples, other and further examples may be devised without departing from the basic scope thereof, and the scope thereof is determined by the claims that follow.

What is claimed is:

1. A method using a testing controller, comprising:
   detecting information associated with a first device under test (DUT), wherein the first DUT is coupled to a testing apparatus via a first set of connectors and the testing apparatus is coupled to the testing controller via a second set of connectors;
   incrementing a use counter in a memory of the testing apparatus based on determining that the use counter is less than a predefined use threshold and the first DUT being connected to the first set of connectors, wherein the use counter indicates a number of times DUTs have been connected to the first set of connectors; and
   testing, based on determining that the use counter is less than the predefined use threshold, the first DUT by transmitting instructions from the testing controller to the first DUT via the testing apparatus.

2. The method of claim 1, further comprising:
   comparing the use counter from the memory of the testing apparatus against a lookup table, the lookup table comprising the predefined use threshold for the testing apparatus;
   connecting a second DUT to the testing apparatus; and
   upon determining that the use counter has met or exceeded the predefined use threshold, aborting a test on the second DUT.

3. The method of claim 1, wherein detecting the information associated with the first DUT comprises:
   detecting identifying information associated with the first DUT; and
   determining that the identifying information has been stored in the memory of the testing apparatus to confirm whether the first DUT has been tested previously, wherein presence of the identifying information in the memory of the testing apparatus indicates that the first DUT has been tested previously.

4. The method of claim 3, wherein the identifying information comprises a unique identifier for the first DUT and a date of manufacture of the first DUT.

5. The method of claim 3, further comprising: upon determining the identifying information has not been stored in the memory of the testing apparatus, storing the information associated with the first DUT in the memory of the testing apparatus.

6. The method of claim 1, wherein testing the first DUT comprises putting the first DUT into a boundary scan mode.

7. A testing apparatus, comprising:
   a first set of connectors configured to connect the testing apparatus to a testing controller;
   a second set of connectors configured to connect the testing apparatus to a device under test (DUT); and
   a memory configured to store a use counter indicating a number of times different DUTs have been connected to the second set of connectors, wherein the use counter is configured to be incremented based on determining that the use counter is less than a predefined use threshold and connecting the DUT to the second set of connectors.

8. The testing apparatus of claim 7, wherein the memory comprises an electrically erasable programmable read-only memory (EEPROM).

9. The testing apparatus of claim 7, wherein the second set of connectors use $I^2C$ protocol for connecting to the DUT.

10. The testing apparatus of claim 7, further comprising:
    a substrate on which the second set of connectors are attached, wherein the second set of connectors are replaceable such that a new set of connectors can be coupled to the substrate.

11. The testing apparatus of claim 10, wherein the use counter is reprogrammable such that the use counter can be reset when the second set of connectors are replaced by the new set of connectors.

12. The testing apparatus of claim 7, wherein the testing apparatus comprises a wearout card.

13. The testing apparatus of claim 7, wherein the first set of connectors facilitate a PCIe connection to the testing controller.

14. The testing apparatus of claim 7, further comprising a printed circuit board (PCB) upon which the first set of connectors, the second set of connectors, and the memory are mounted.

15. The testing apparatus of claim 7, wherein the second set of connectors facilitate a PCIe connection to the DUT and have a maximum number of insertions to the DUT before the second set of connectors begin wearing out.

16. The testing apparatus of claim 7, further comprising support circuitry to connect the first set of connectors to the second set of connectors.

17. A testing system, comprising:
    a testing apparatus coupled to a testing controller and to a first device under test (DUT), the testing apparatus comprising:
      a first set of connectors coupling the testing apparatus to the testing controller;
      a second set of connectors coupling the testing apparatus to the first DUT; and
      a memory configured to store identifying information of the testing apparatus, and a use counter indicating a number of times different DUTs have been connected to the second set of connectors; and
    the testing controller coupled to a host processor, wherein the testing controller is configured to:
      detect information associated with the first DUT;
      increment the use counter based on determining that the use counter is less than a predefined use threshold and the first DUT being connected to the second set of connectors; and
      perform testing on the first DUT based on determining that the use counter is less than the predefined use threshold.

18. The system of claim 17, wherein the testing controller is further configured to:
- compare the use counter from the memory of the testing apparatus against a lookup table, the lookup table comprising the predefined use threshold for the testing apparatus;
- connect a second DUT to the testing apparatus; and
- upon determining the use counter has met or exceeded the predefined use threshold, abort testing on the second DUT.

19. The system of claim 17, wherein the testing controller is configured to detect the information associated with the first DUT by:
- detecting identifying information associated with the first DUT; and
- determining that the identifying information associated with the first DUT has been stored in the memory of the testing apparatus to confirm whether the first DUT has been tested previously, wherein presence of the identifying information in the memory of the testing apparatus indicates that the first DUT has been tested previously.

20. The system of claim 17, wherein the testing apparatus further comprises:
- a substrate on which the second set of connectors are attached, wherein the second set of connectors are replaceable such that a new set of connectors can be coupled to the substrate.

* * * * *